United States Patent
LiCausi et al.

(10) Patent No.: US 8,481,410 B1
(45) Date of Patent: Jul. 9, 2013

(54) METHODS OF EPITAXIAL FINFET

(75) Inventors: Nicholas LiCausi, Watervilet, NY (US); Jeremy Wahl, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 8 days.

(21) Appl. No.: 13/362,398

(22) Filed: Jan. 31, 2012

(51) Int. Cl.
*H01L 21/20* (2006.01)

(52) U.S. Cl.
USPC ......... 438/478; 438/197; 438/212; 438/233; 438/285; 438/300; 257/253; 257/255; 257/272; 257/350; 257/368; 257/E21.129

(58) Field of Classification Search
None
See application file for complete search history.

(56) References Cited

U.S. PATENT DOCUMENTS 6,855,620 B2 * 2/2005 Koike et al. ............... 438/481

* cited by examiner

*Primary Examiner* — Kyoung Lee
(74) *Attorney, Agent, or Firm* — Williams, Morgan & Amerson, P.C.

(57) ABSTRACT

Disclosed herein are various methods for better height control of the finFET patterned fins. In one example, this invention begins by depositing or growing an oxide material, for example, silicon dioxide. This oxide material is then patterned and etched to open windows or trenches to the substrate where fins will be grown. If a common channel material is desired, it is epitaxially grown in the windows. Then, some windows are covered and one pole of fins (for example nFET) are epitaxially grown in the exposed windows. The previously masked windows are opened and the newly formed fins are masked. The alternate channel material is then grown. The masked fins are then un-masked and the oxide is recessed to allow the fins to protrude from the oxide. This invention also allows for different channel materials for NMOS and PMOS.

20 Claims, 23 Drawing Sheets

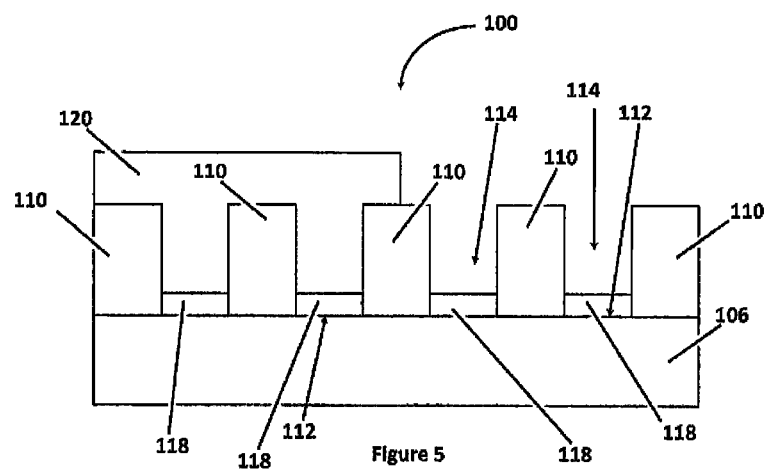
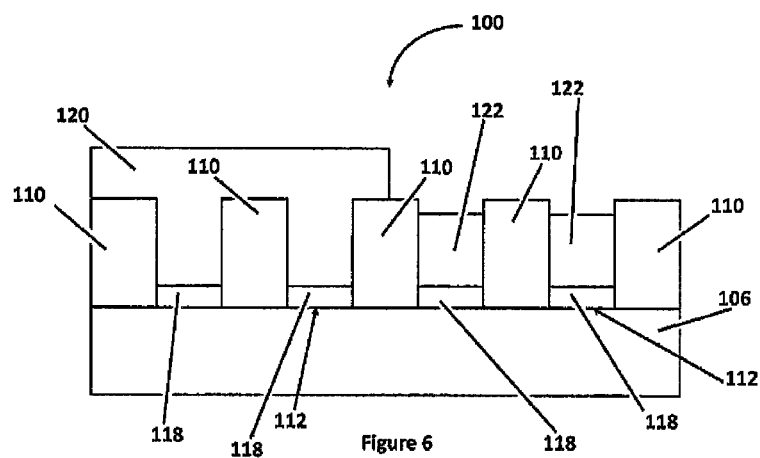

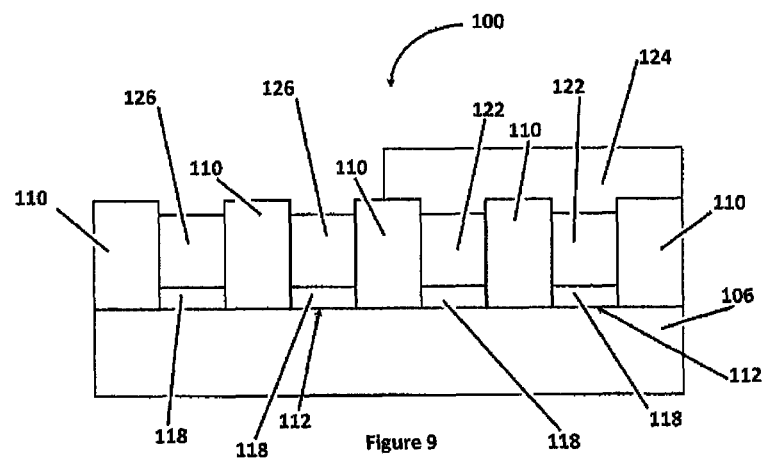
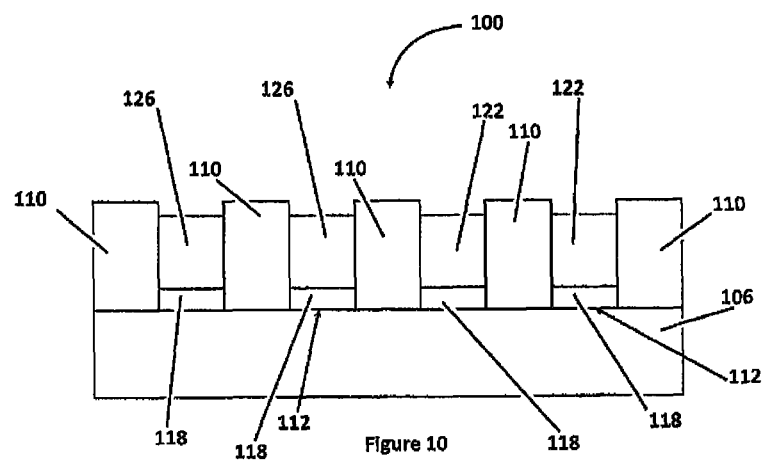

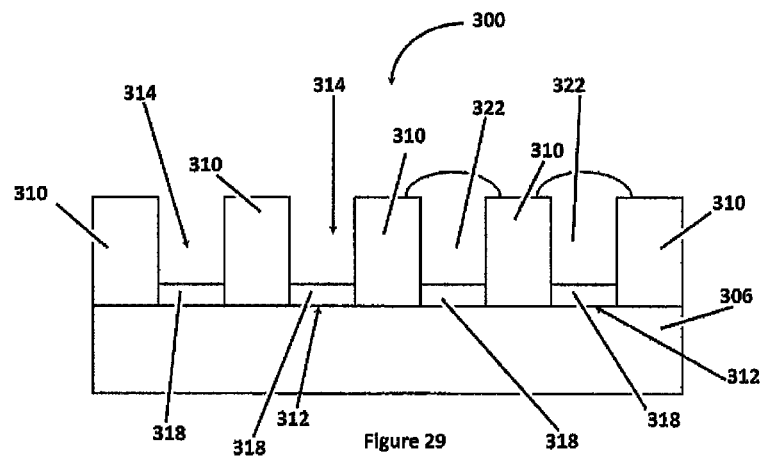
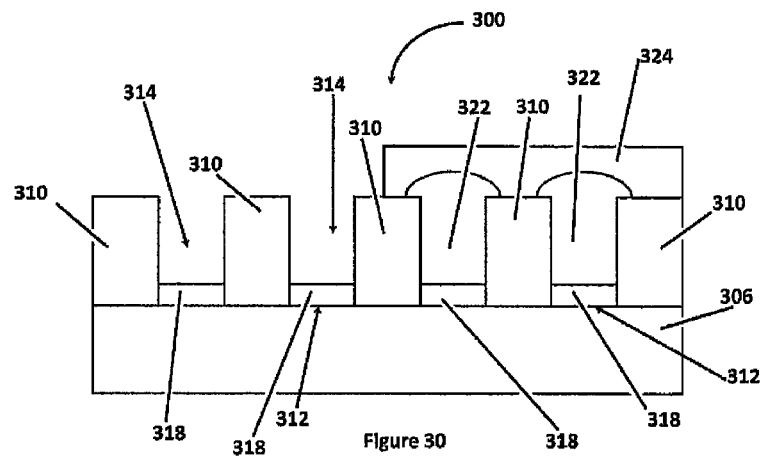

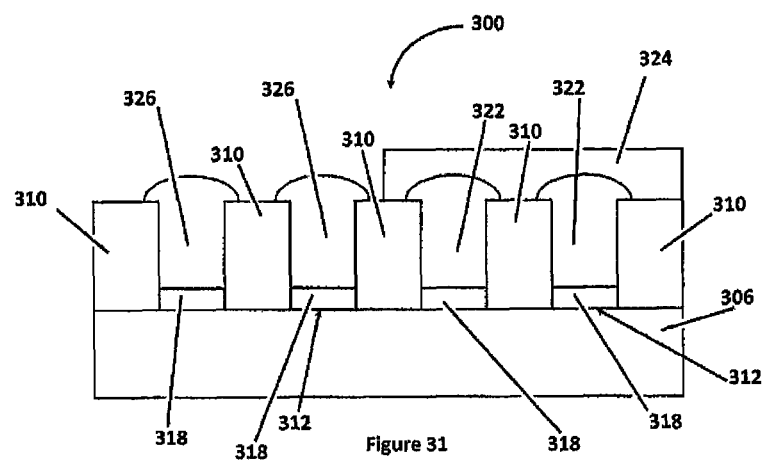
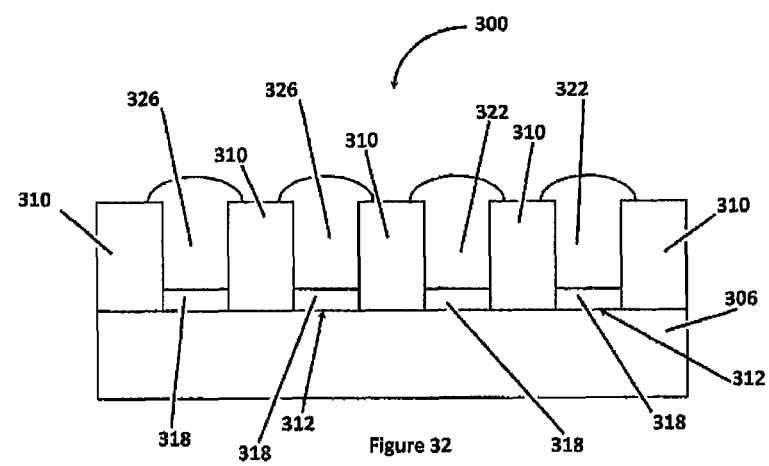

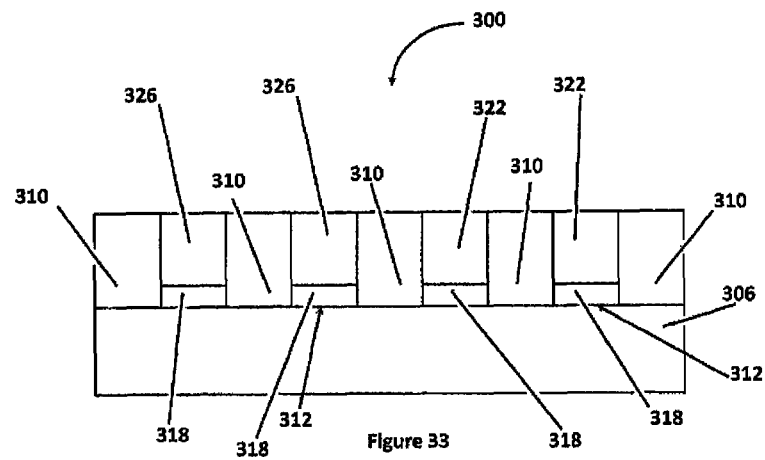
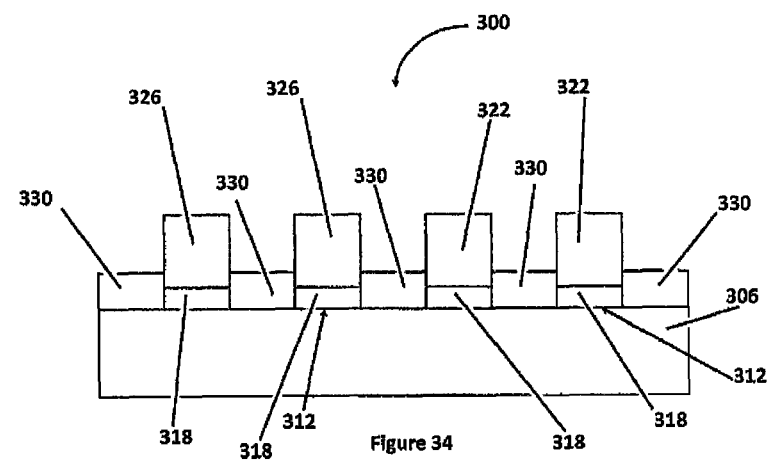

METHODS OF EPITAXIAL FINFET

BACKGROUND OF THE INVENTION

1. Field of the Invention

Generally, the present invention relates to the manufacturing of sophisticated semiconductor devices, and, more specifically, to various methods of improved fabrication and height control of structures used in integrated circuit devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Device designers have been very successful in improving the electrical performance capabilities of transistor devices, primarily by reducing the size of or "scaling" various components of the transistor, such as the gate length of the transistors. As size is reduced, the control of the height of fin structures on bulk substrates is difficult. Furthermore, existing methods make a CMOS flow difficult when attempting to use alternative channel materials for nFET and pFET. Conventional finFET fin formation utilizes a hard-mask and etching to etch away surrounding area, creating the fin. The trenches on each side of the fin are then filled with oxide, and excess oxide is removed with chemical mechanical planarization (CMP) and/or oxide etching. This can lead to non-uniform fin height. Also, the fins are sometimes clad with epitaxially grown silicon/germanium (SiGe) or germanium (Ge) to enhance nFET and pFET performance, respectively. Critical dimension (CD) and profile matching is difficult for differing nFET and pFET channel materials with separate etching. Common etching may not be possible for potential channel materials of silicon (Si) or group III-V semiconductor materials for nFET, and SiGE or Ge for pFET.

The present disclosure is directed to various methods of fabricating features in an integrated circuit structure, using an improved fin height control technique. These techniques can be used in CMOS circuits with alternative channel materials or traditional materials.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for better height control of the finFET patterned fins. In one example, the method includes forming a layer on a substrate, patterning that layer to create trenches, then depositing or growing a common stack material in the trenches. Next, a pFET masking material is formed over a portion of the structure, and then an nFET channel material is formed in the unmasked trenches. The pFET masking material is then removed and an nFET masking material is formed over the portion of the structure that includes the nFET channel material. Next a pFET channel material is formed in the unmasked trenches. Finally the nFET masking material is removed and the patterned layer is recessed to expose pFET channel material and nFET channel material fin structures.

In other illustrative examples, the common stack material is formed on the substrate prior to forming the layer used to create trenches. In other embodiments, the method includes the additional step of providing a planarization method to create a flush surface prior to the last recessing step.

One embodiment of this invention begins by depositing or growing an oxide material, for example, silicon dioxide. This oxide material is then patterned and etched to open windows or trenches to the substrate where fins will be grown. If a common channel material (for example Si:2% C) is desired, it is epitaxially grown in the windows. Then, some windows are covered and one pole of fins (for example nFET) are epitaxially grown in the exposed windows (with Si as an example). The previously masked windows are opened and the newly formed fins are masked. The alternate channel material is then grown (i.e., Ge for pFETs). The masked fins are then un-masked and the silicon dioxide is recessed to allow the fins to protrude from the oxide. The existing fin formation flow requires approximately 17 steps. This flow could require less than 14 steps. It also offers a solution for improved fin height control and improved sidewall profile control. This invention also allows for different channel materials for NMOS and PMOS.

Various embodiments of this invention allow for CMOS flow with epitaxially grown finFETs for height control and channel enhancement. This invention can be performed without using CMP and with common channel material in the fin (using 10 steps), without using CMP and with common channel material throughout (using 10 steps), using CMP and with common channel material in the fin (using 11 steps), and using CMP and with common channel material throughout (using 11 steps).

This invention also allows the finFET channels to be produced using different channel material (for example, Ge for pFET and Si for nFET). This invention is extendable to group III-V semiconductor materials. Instead of a Si substrate, an InP buffer could be used as the "substrate." This flow does not need a hard-mask to etch the fins and makes removal of the hard-mask unnecessary. Initial oxide patterning can be done using various methods, such as conventional lithography, extreme ultraviolet lithography (EUV), or sidewall image transfer (SIT). Use of the tight pitch trenches allows for the incorporation of either strained or relaxed channels.

BRIEF DESCRIPTION OF THE DRAWINGS

The disclosure may be understood by reference to the following description taken in conjunction with the accompanying drawings, in which like reference numerals identify like elements, and in which:

In general, FIGS. 1-46 show cross-section views of a structure going through various illustrative examples of fabrication steps of an improved process used in forming integrated circuit device structures, in accordance with embodiments of the present invention.

Figure 1:
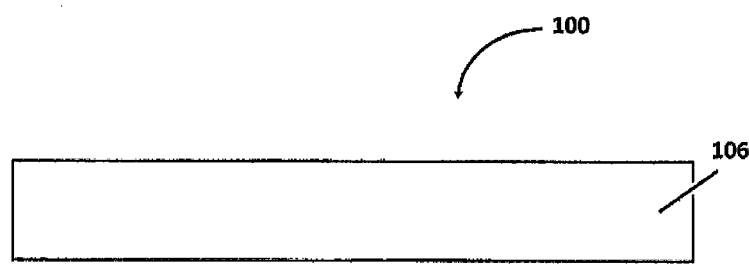

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of controlling the height of a structure used in forming integrated circuit devices or in a semiconducting substrate. As will be readily apparent to those skilled in the art upon a complete reading of the present application, the present method is applicable to a variety of devices, including, but not limited to, ASICs, logic devices, memory devices, etc. Moreover, the present invention may be employed in forming any of a variety of different types of features formed on an integrated circuit product, such as lines, trenches, gate electrode structures, fins for finFET devices, contact structures, back-end-of-line (BEOL) structures, etc.

Portions of the finFET device structure are formed using well-known techniques and process steps (e.g., techniques and steps related to doping, photolithography and patterning, etching, material growth, material deposition, surface planarization, and the like) that will not be described in detail here. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

The techniques and technologies described herein may be utilized to fabricate MOS transistor devices, including NMOS transistor devices, PMOS transistor devices, and CMOS transistor devices. In particular, the process steps described herein can be utilized in conjunction with any semiconductor device fabrication process that forms gate structures for transistors. Although the term "MOS device" properly refers to a device having a metal gate electrode and an oxide gate insulator, that term may be used to refer to any semiconductor device that includes a conductive gate electrode (whether metal or other conductive material) that is positioned over a gate insulator (whether oxide or other insulator) which, in turn, is positioned over a semiconductor substrate.

Certain terminology may also be used in the following description for the purpose of reference only, and thus are not intended to be limiting. For example, terms such as "upper," "lower," "above" and "below" refer to directions in the drawings to which reference is made. Terms such as "front," "back," "rear," "side," "outboard" and "inboard" describe the orientation and/or location of portions of a feature or element within a consistent but arbitrary frame of reference which is made clear by reference to the text and the associated drawings describing the item under discussion. Such terminology may include the words specifically mentioned above, derivatives thereof, and words of similar import. Similarly, the terms "first," "second" and other such numerical terms referring to structures do not imply a sequence or order unless clearly indicated by the context. With reference to the attached drawings, various illustrative embodiments of the methods and devices disclosed herein will now be described in more detail.

The figures illustrate versions using CMP and not using CMP. They also depict the use of a continuous common channel material and isolated common channel material. The present disclosure is directed to various methods of finFET fabrication and to finFET devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 1-46, various illustrative embodiments of the methods disclosed herein will now be described in more detail. Additionally, the term "substrate" as used herein is intended to be very broad in nature and cover any type or structure or form of a channel region of a transistor that is commonly in contact with or positioned below a gate insulation layer, such as a layer of silicon-germanium that is commonly found in PMOS devices. The term "substrate" should also be understood to cover any of a variety of different semiconductor materials, such as silicon, silicon germanium, gallium arsenide, etc. Instead of a silicon substrate, an InP buffer could be used as the substrate.

FIGS. 1-11 show cross-section views of a structure 100 going through fabrication steps of an improved finFET fabrication process, in accordance with embodiments of the present invention. More specifically, FIG. 1, in one embodiment, shows a cross-sectional view of a semiconductor device 100 in an early manufacturing stage. With reference to FIG. 1, the improved finFET process may start out with providing a semiconductor substrate 106. The substrate 106 may have a variety of configurations, such as the depicted bulk silicon configuration. The substrate may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate may also be made of materials other than silicon. The substrate material 106 is preferably a silicon material as typically used in the semiconductor industry, e.g., relatively pure silicon as well as silicon admixed with other elements such as germanium, carbon, and the like.

Figure 2:
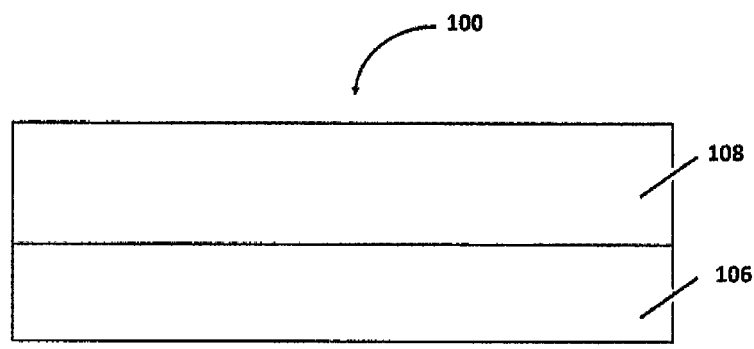

Next with reference to FIG. 2, a material layer 108 is formed over the top of the substrate 106. In one embodiment, the material layer 108 is an insulator. The material layer 108 may be an oxide, such as $SiO_2$, and may be formed by plasma enhanced atomic layer deposition (PEALD), low pressure chemical vapor deposition (LPCVD), chemical vapor deposition (CVD), thermally grown or deposited with other methods.

Figure 3:
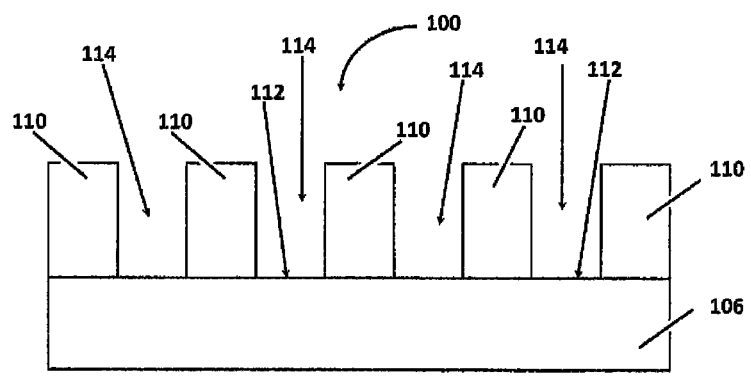

Next with reference to FIG. 3, the material layer 108 is patterned into at least one patterned material structure 110. The material layer 108 may be patterned by etching material layer 108 to define a trench 114 and a substrate top surface 112. In one embodiment, the material layer 108 etching may be performed by plasma-based etching, leaving the at least one patterned material structure 110, defining a trench width from 5-25 nm.

Figure 4:
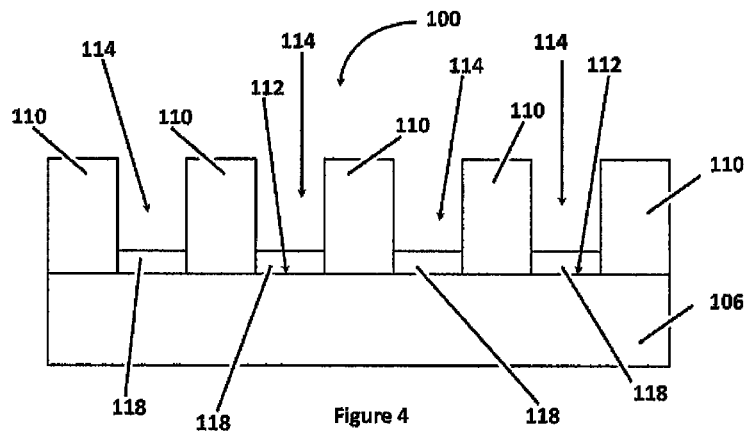

Next with reference to FIG. 4, the common stack material 118 is formed over the substrate top surface 112. In one embodiment, the common stack material 118 may be formed by epitaxially growing the common stack material 118. The common stack material 118 may be Si—C, in the case of Si or SiGe channels, or could be InP in the case of group III-V semiconductor material channels. In one embodiment, the common stack material 118 may be 5-20 nm thick.

Next with reference to FIG. 5, a pFET masking material 120 is masked on a first portion of the common stack material 118 and a first portion of the at least one patterned material structure 110 proximate to the first portion of the common stack 118. In one embodiment, the masking of the pFET masking material 120 may include depositing and patterning the pFET masking material 120. The pFET masking material 120 may be $Si_3N_4$, TiN, $SiO_2$, etc.

Next with reference to FIG. 6, an nFET channel material 122 is formed on a second portion of the common stack material 118. In one embodiment, the nFET channel material 122 may be formed by epitaxially growing the nFET channel material 122. The nFET channel material 122 may be Si or group III-V semiconductor material. In one embodiment, the nFET channel material 122 may be 20-100 nm thick.

Figure 7:
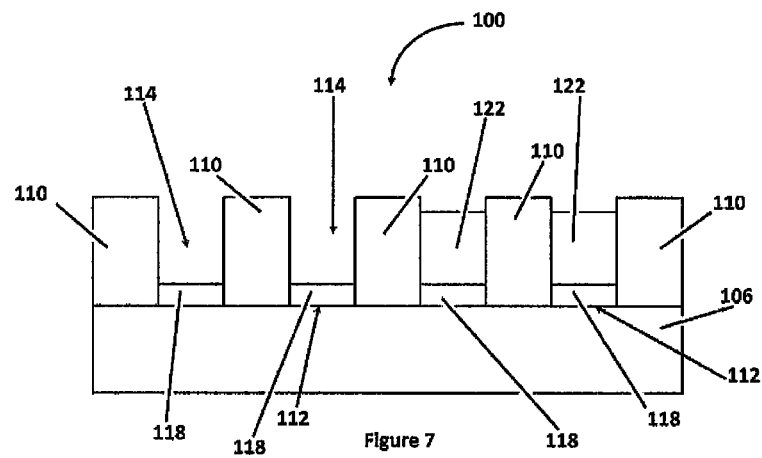

Next with reference to FIG. 7, the pFET masking material 120 is removed. In one embodiment, the pFET masking material 120 removal may be performed by plasma-based processing or "wet" chemical methods.

Figure 8:
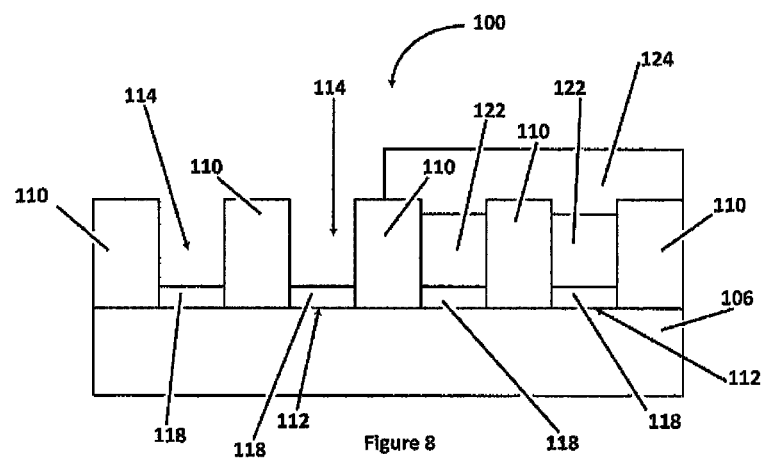

Next with reference to FIG. 8, an nFET masking material 124 is masked on the nFET channel material 122 and a portion of the at least one patterned material structure 110 proximate to the nFET channel material 122. In one embodiment, the masking may be performed by depositing and patterning the nFET masking material 124. In one embodiment, the nFET masking material 124 may be $Si_3N_4$, TiN, $SiO_2$, etc.

Next with reference to FIG. 9, a pFET channel material 126 is formed on the first portion of the common stack material 118. In one embodiment, the pFET channel material 126 may be epitaxially grown. The pFET channel material 126 may have a Ge content, ranging from 25-100%, and may be from 20-100 nm thick.

Next with reference to FIG. 10, the nFET masking material 124 is removed. In one embodiment, the nFET masking material 124 removal may be performed by plasma-based processing or "wet" chemical methods.

Figure 11:
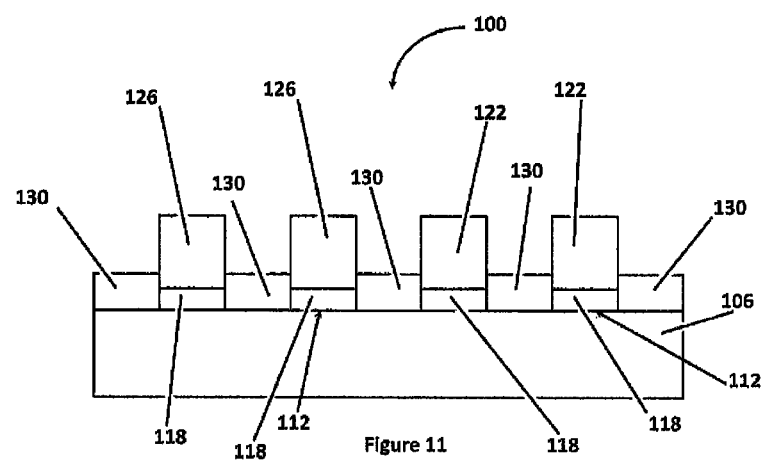

Next with reference to FIG. 11, the at least one patterned material structure 110 is recessed to recessed structure 130. In one embodiment, the recessing may be performed by plasma-based processing, sublimation-based processing, or "wet" chemical processing. In one embodiment, the patterned material 110 may be recessed to a depth range of 15-30 nm.

Figure 12:
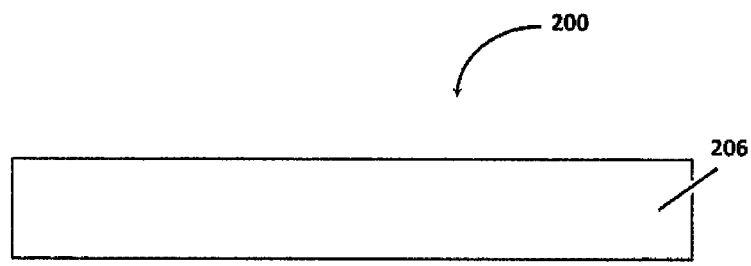

FIGS. 12-22 show cross-section views of a structure 200 going through fabrication steps of an improved finFET fabrication process, in accordance with embodiments of the present invention. More specifically, FIG. 12, in one embodiment, shows a cross-sectional view of a semiconductor device 200 in an early manufacturing stage. With reference to FIG. 12, the improved finFET process may start out with providing a semiconductor substrate 206.

Figure 13:
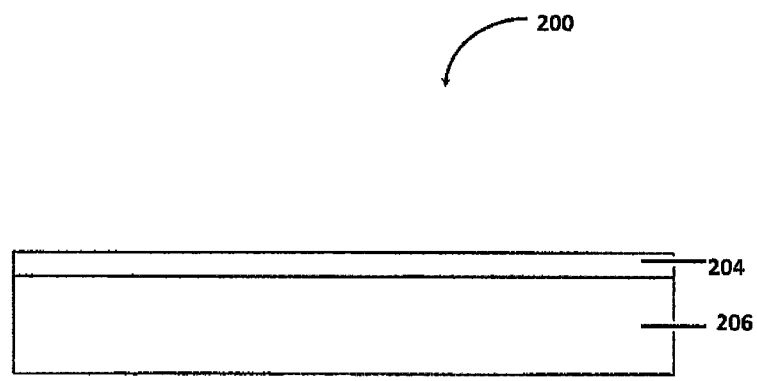

Next with reference to FIG. 13, a common stack layer 204 is formed over the substrate 206. In one embodiment, the common stack layer 204 may be SiC in the case of Si or SiGe channels or could be InP in the case of group III-V material channels and may be formed by epitaxial growth or other deposition methods. In one embodiment, the common stack layer 204 may be 5-20 nm thick.

Figure 14:
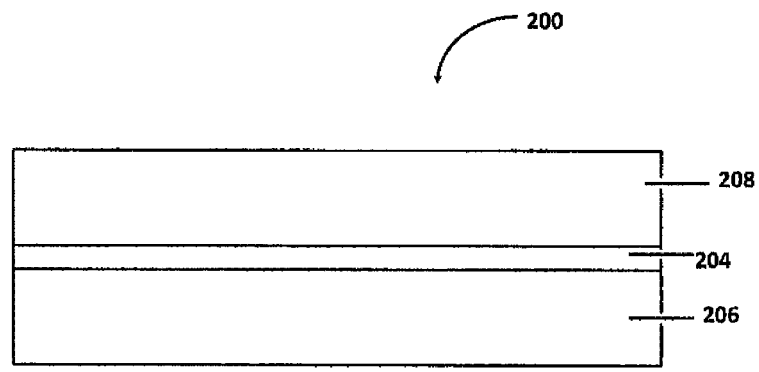

Next with reference to FIG. 14, a material layer 208 is formed over the common stack layer 204. In one embodiment, the material layer 208 may be silicon oxide or silicon nitride and may be formed by various depositing or growth methods.

Figure 15:
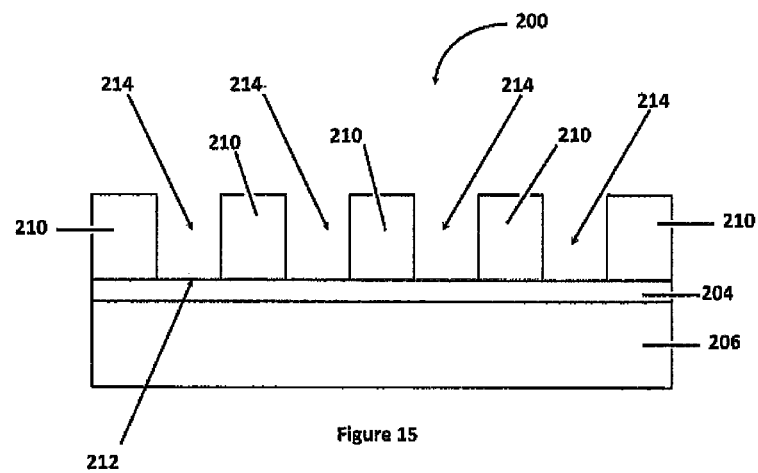

Next with reference to FIG. 15, the material layer 208 is patterned into at least one patterned material structure 210. The material layer 208 may be patterned by etching material layer 208 to define a trench 214 and a channel layer top surface 212. In one embodiment, the material layer 208 etching may be performed by plasma-based processing, leaving the patterned material 210.

Figure 16:
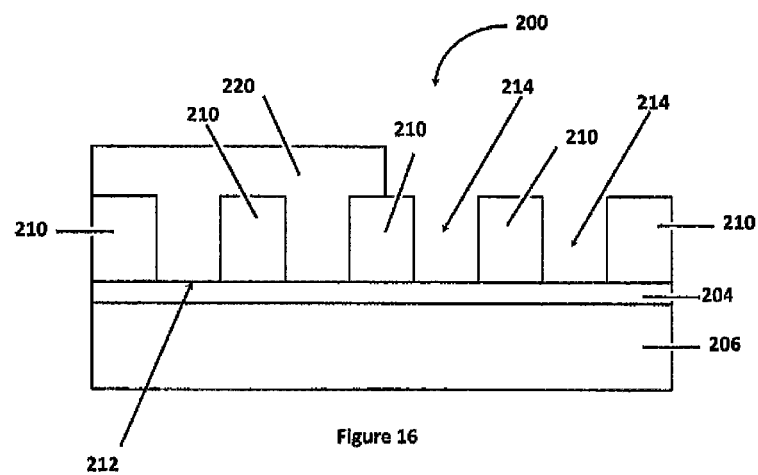

Next with reference to FIG. 16, a pFET masking material 220 is masked on a first portion of the channel layer 204 and a first portion of the at least one patterned material structure 210. In one embodiment, the masking of the pFET masking material 220 may include depositing and patterning the pFET masking material 220. The pFET masking material 220 can be $Si_3N_4$, TiN, $SiO_2$, etc.

Figure 17:
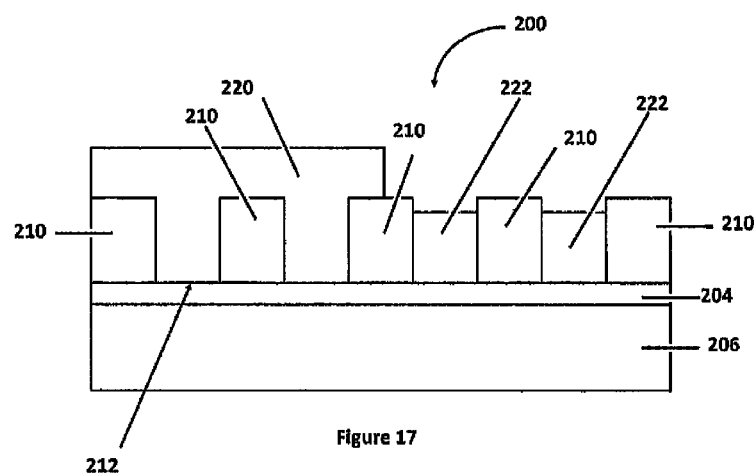

Next with reference to FIG. 17, an nFET channel material 222 is formed on a second portion of the common stack layer 204. In one embodiment, the nFET channel material 222 may be formed by epitaxially growing the nFET channel material 222. The nFET channel material 222 may be Si or group III-V semiconductor material. In one embodiment, the nFET channel material 222 may be 20-100 nm thick.

Figure 18:
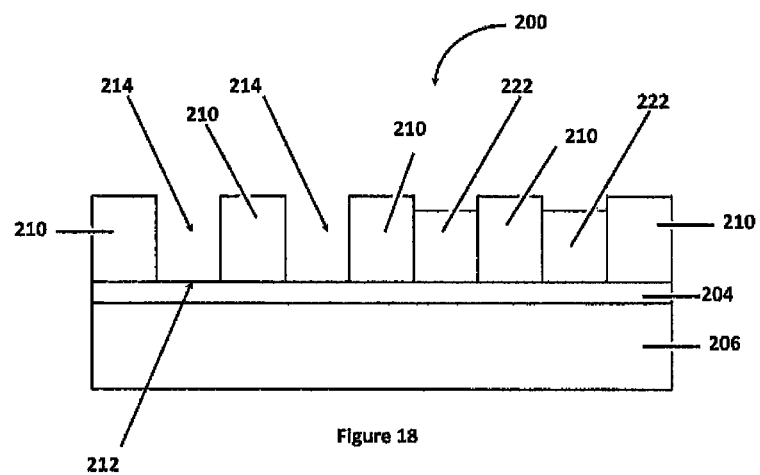

Next with reference to FIG. 18, the pFET masking material 220 is removed. In one embodiment, removal of the pFET masking material 220 may be performed by "wet" chemical removal.

Figure 19:
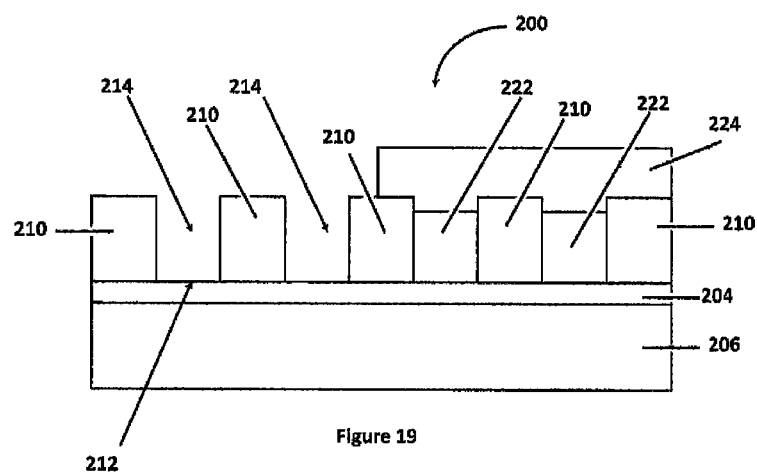

Next with reference to FIG. 19, an nFET masking material 224 is masked on the nFET channel material 222 and a second portion of the at least one patterned material structure 210 proximate to the nFET channel material 222. In one embodiment, the masking may be performed by depositing and patterning the nFET masking material 224. In one embodiment, the nFET masking material 224 may be $Si_3N_4$, TiN, $SiO_2$, etc.

Figure 20:
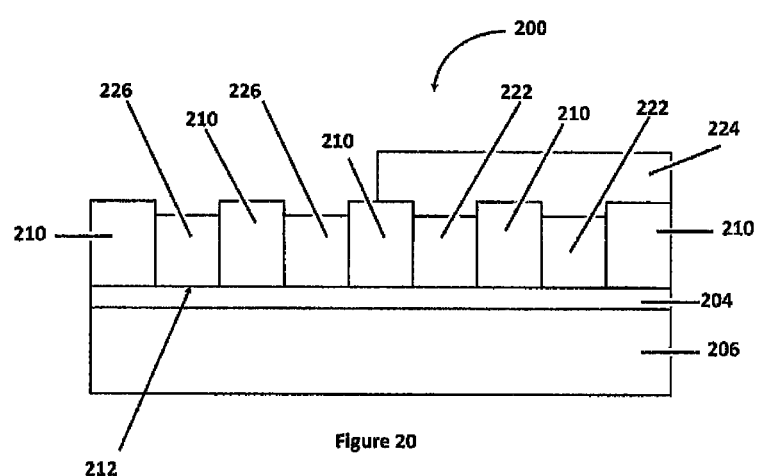

Next with reference to FIG. 20, a pFET channel material 226 is formed on the first portion of the common stack layer 204. In one embodiment, the pFET channel material 226 may be epitaxially grown. The pFET channel material 226 may have a Ge content ranging between 25-100%. In one embodiment, the pFET channel material 226 may be 20-100 nm thick.

Figure 21:
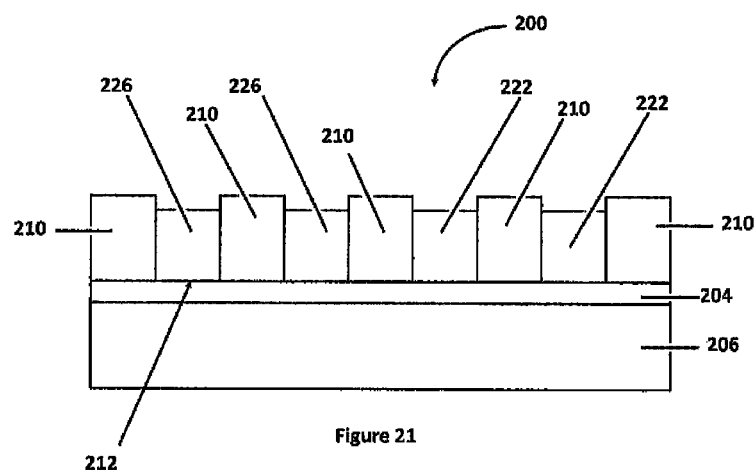

Next with reference to FIG. 21, the nFET masking material 224 is removed. In one embodiment, the nFET masking material 224 removal may be performed by "wet" chemical removal.

Figure 22:
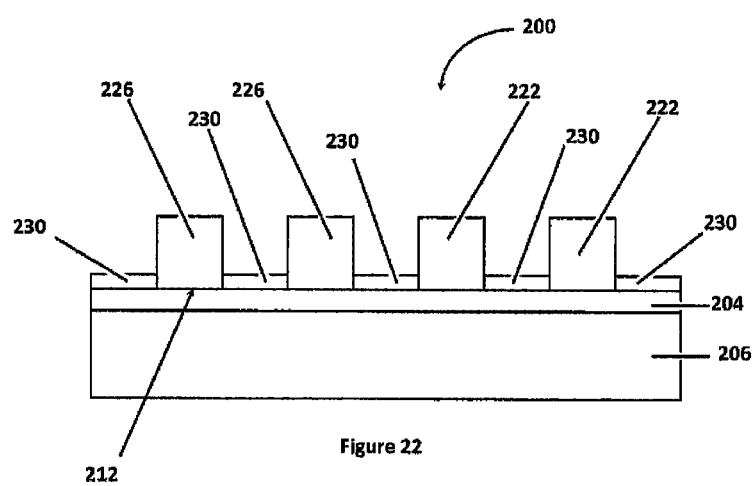

Next with reference to FIG. 22, at least one patterned material structure 210 is recessed to recessed structure 230. In one embodiment, the recessing may be performed by plasma-based processing, sublimation techniques or "wet" chemical based methods. In one embodiment, the at least one patterned material structure 210 may be recessed to a depth range of 15-35 nm.

Figure 23:
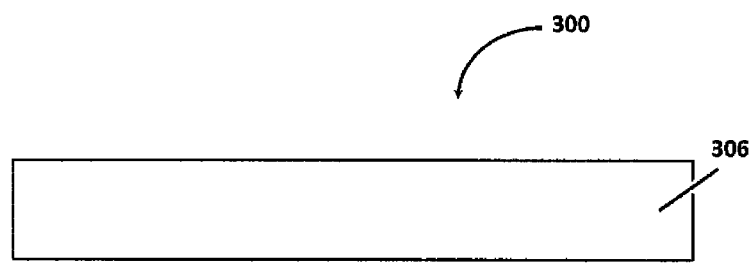

FIGS. 23-34 show cross-section views of a structure 300 going through fabrication steps of an improved finFET fabrication process, in accordance with embodiments of the present invention. More specifically, FIG. 23, in one embodiment, shows a cross-sectional view of a semiconductor device 300 in an early manufacturing stage. With reference to FIG. 23, the improved finFET process may start out with providing a semiconductor substrate 306.

Figure 24:
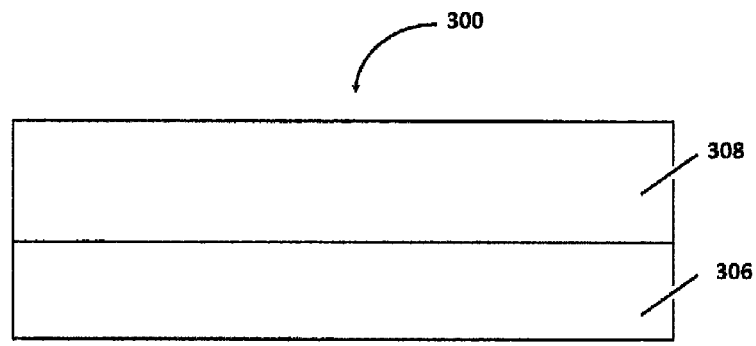

Next with reference to FIG. 24, a material layer 308 is formed over the substrate 306. In one embodiment, the material layer 308 is an insulator. The material layer 308 may be oxide, such as $SiO_2$, and may be formed by deposition or thermal oxidation methods.

Figure 25:
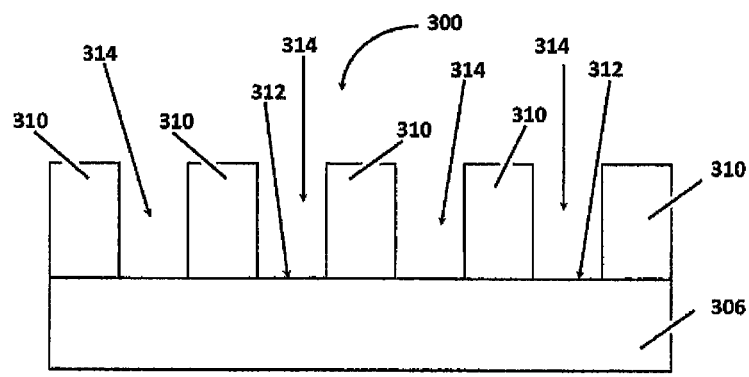

Next with reference to FIG. 25, the material layer 308 is patterned into at least one patterned material structure 310. The material layer 308 may be patterned by etching material layer 308 to define a trench 314 and a substrate top surface 312. In one embodiment, the material layer 308 etching may be performed by plasma-based processing, leaving the at least one patterned material structure 310.

Figure 26:
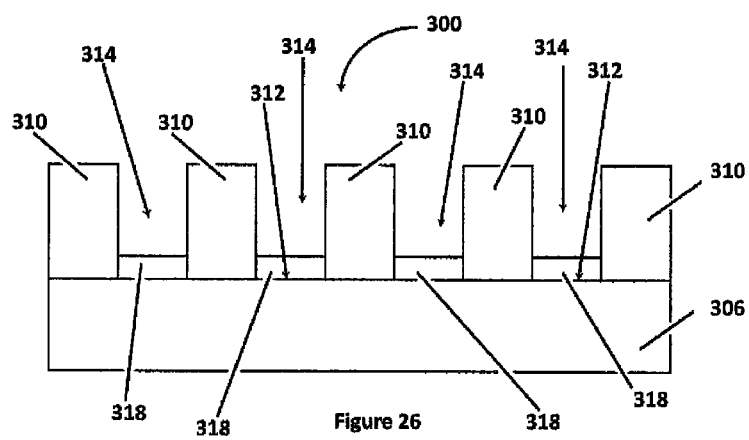

Next with reference to FIG. 26, the common stack material 318 is formed over the substrate top surface 312. In one embodiment, the common stack material 318 may be formed by epitaxially growing the common stack material 318. The common stack material 318 may be Si—C, uniquely doped Si, etc. In one embodiment, the common stack material 318 may be 5-15 nm thick.

Figure 27:
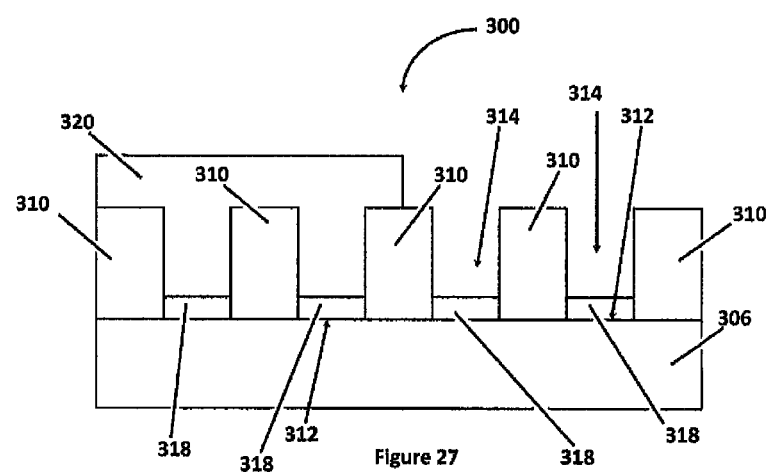

Next with reference to FIG. 27, a pFET masking material 320 is masked on a first portion of the common stack material 318 and the at least one patterned material structure 310 proximate to the first portion of the common stack 318. In one embodiment, the masking of the pFET masking material 320 may include depositing and patterning the pFET masking material 320. The pFET masking material 320 may be $Si_3N_4$, Tin, $SiO_2$, etc.

Figure 28:
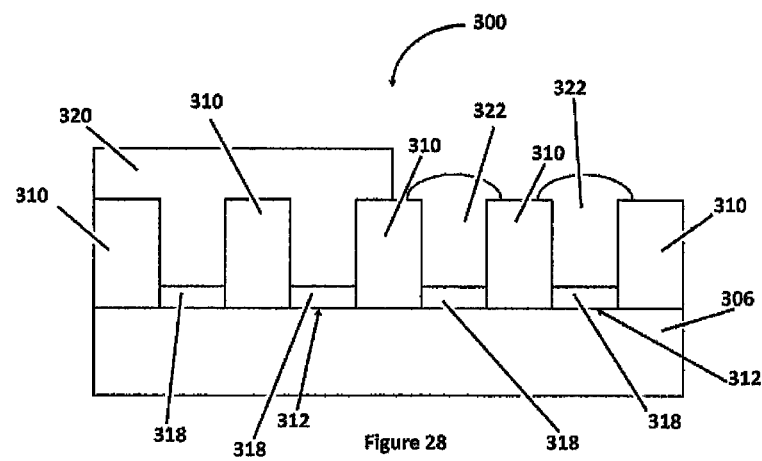

Next with reference to FIG. 28, an nFET channel material 322 is formed on a second portion of the common stack 318 and may be formed to a height above a height of a proximate patterned material structure 310. In one embodiment, the nFET channel material 322 may be formed by epitaxially growing the nFET channel material 322. The nFET channel material 322 may be Si, uniquely doped Si, etc. In one embodiment, the nFET channel material 322 may be 40-60 nm thick.

Next with reference to FIG. 29, the pFET masking material 320 is removed. In one embodiment, the pFET masking material removal 320 may be performed by "wet" chemical etching.

Next with reference to FIG. 30, an nFET masking material 324 is masked on the nFET channel material 322 and a portion of the at least one patterned material structure 310 proximate to the nFET channel material 322. In one embodiment, the masking may be performed by depositing and patterning the nFET masking material 324. In one embodiment, the nFET masking material 324 may be $Si_3N_4$, TiN, $SiO_2$, etc.

Next with reference to FIG. 31, a pFET channel material 326 is formed on the first portion of the common stack material 318 and may be formed to a height above a height of a proximate patterned material structure 310. In one embodiment, the pFET channel material 326 may be epitaxially grown. The pFET channel material 326 may have a Ge content ranging between 25-100%. In one embodiment, the pFET channel material 326 has a range of 40-60 nm thick.

Next with reference to FIG. 32, the nFET masking material 324 is removed. In one embodiment, the nFET masking material 324 removal may be performed by "wet" chemical removal.

Next with reference to FIG. 33, the pFET channel material 326 and the nFET channel material 322 are made flush with the at least one patterned material structure 310. In one embodiment, this may be performed by CMP.

Next with reference to FIG. 34, the at least one patterned material structure 310 is recessed to recessed structure 330. In one embodiment, the recessing may be performed by "wet" chemical removal, sublimation-based methods or plasma-based processing. In one embodiment, the patterned material 310 may be recessed to a depth range of 25-35 nm.

Figure 35:
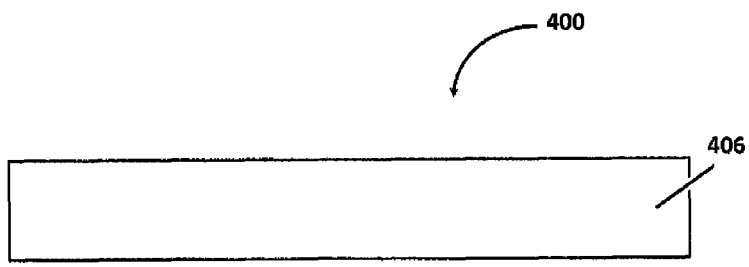

FIGS. 35-46 show cross-section views of a structure 400 going through fabrication steps of an improved finFET fabrication process, in accordance with embodiments of the present invention. More specifically, FIG. 35, in one embodiment, shows a cross-sectional view of a semiconductor device 400 in an early manufacturing stage. With reference to FIG. 35, the improved finFET process may start out with providing a semiconductor substrate 406.

Figure 36:

Next with reference to FIG. 36, a common stack layer 404 is formed over the substrate 406. In one embodiment, the common stack layer 404 may be SiC, uniquely doped Si, etc, and may be formed by deposition techniques or epitaxially grown. In one embodiment, the common stack layer 404 may be 5-20 nm thick.

Figure 37:
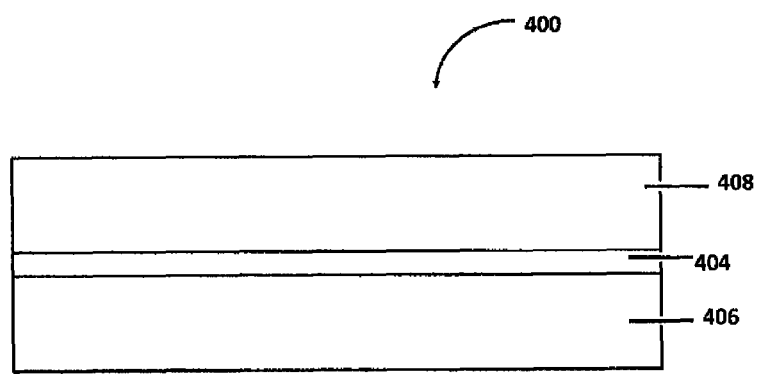

Next with reference to FIG. 37, a material layer 408 is formed over the common stack layer 404. In one embodiment, the material layer 408 may be oxide, nitride, etc., and may be formed by typical deposition methods.

Figure 38:
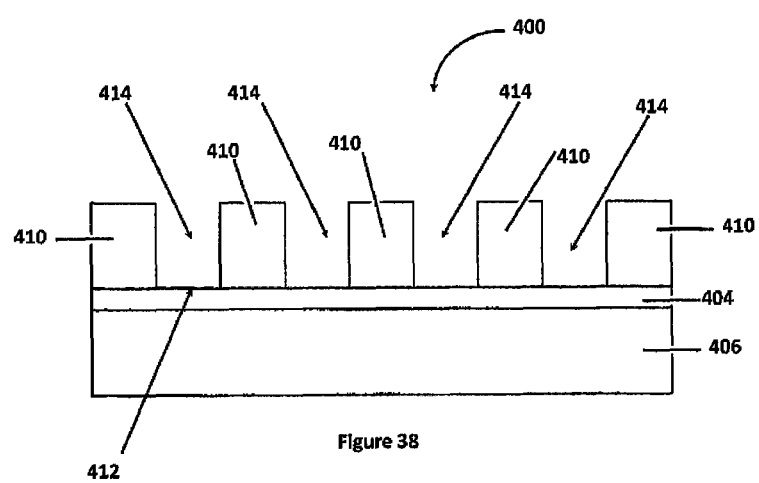

Next with reference to FIG. 38, the material layer 408 is patterned into at least one patterned material structure 410. The material layer 408 may be patterned by etching material layer 408 to define a trench 414 and a channel layer top surface 412. In one embodiment, the material layer 408 etching may be performed by plasma-based processing, leaving the at least one patterned material structure 410.

Figure 39:
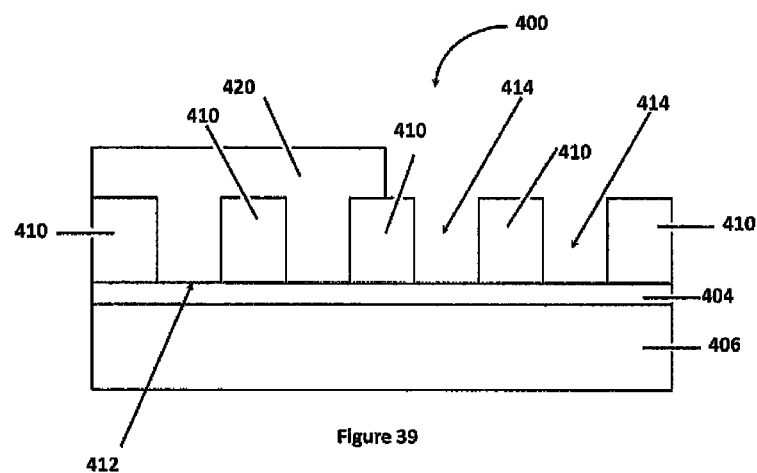

Next with reference to FIG. 39, a pFET masking material 420 is masked on a first portion of the channel layer 404 and a first portion of the at least one patterned material structure 410. In one embodiment, the masking of the pFET masking material 420 may include depositing and patterning the pFET masking material 420. The pFET masking material 420 can be $Si_3N_4$, TiN, $SiO_2$, etc.

Figure 40:
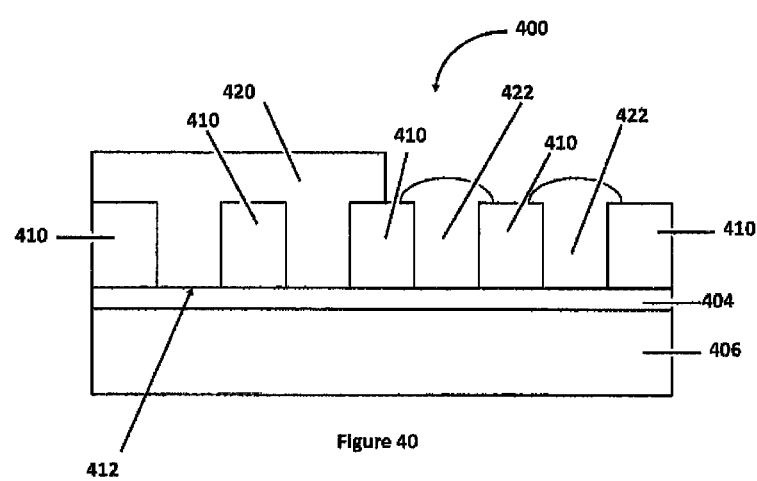

Next with reference to FIG. 40, an nFET channel material 422 is formed on a second portion of the common stack layer 404 and may be formed to a height above a height of a proximate patterned material structure 410. In one embodiment, the nFET channel material 422 may be formed by epitaxially growing the nFET channel material 422. The nFET channel material 422 may be Si, uniquely doped Si, etc. In one embodiment, the nFET channel material 422 may be 40-60 nm thick.

Figure 41:
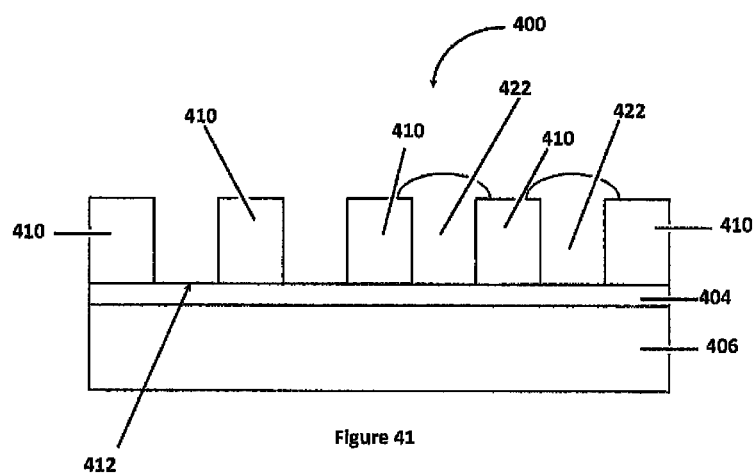

Next with reference to FIG. 41, the pFET masking material 420 is removed. In one embodiment, removal of the pFET masking material 420 may be performed by "wet" chemical removal.

Figure 42:
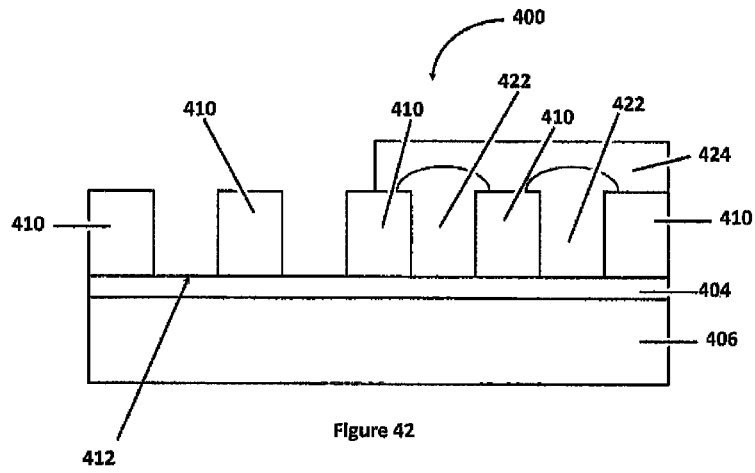

Next with reference to FIG. 42, an nFET masking material 424 is masked on the nFET channel material 422 and a second portion of the at least one patterned material structure 410 proximate to the nFET channel material 422. In one embodiment, the masking may be performed by depositing and patterning the nFET masking material 424. In one embodiment, the nFET masking material 424 may be $Si_3N_4$, TiN, $SiO_2$, etc.

Figure 43:
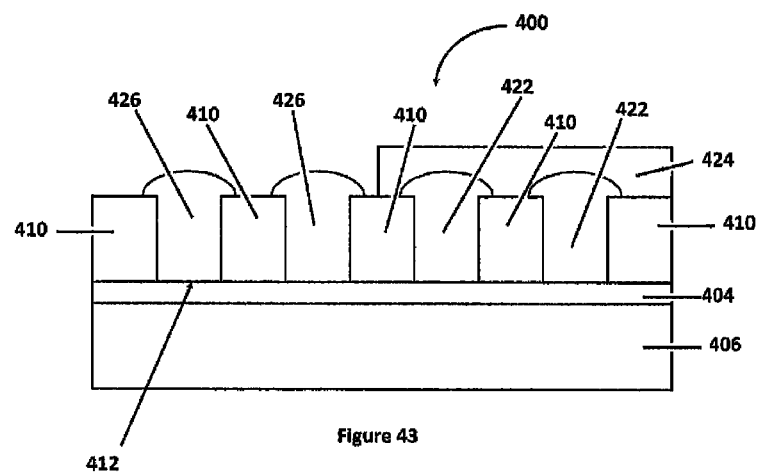

Next with reference to FIG. 43, a pFET channel material 426 is formed on the first portion of the common stack layer 404 and may be formed to a height above a height of a proximate patterned material structure 410. In one embodiment, the pFET channel material 426 may be epitaxially grown. The pFET channel material 426 may have a Ge content in the range of 25-100%. In one embodiment, the pFET channel material 426 may be 40-60 nm thick.

Figure 44:
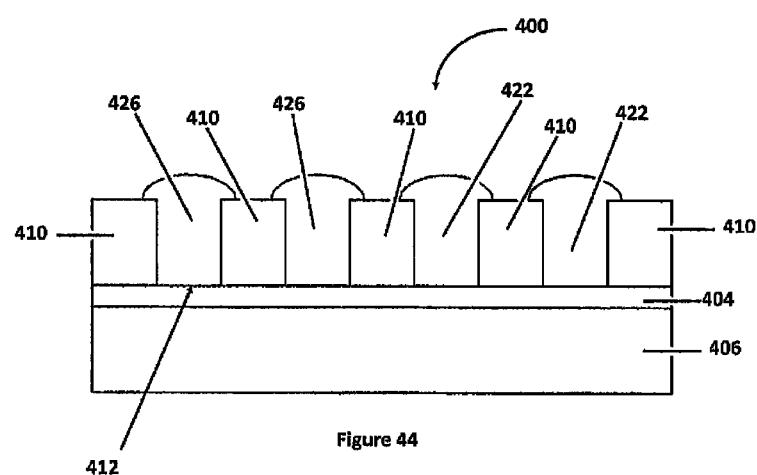

Next with reference to FIG. 44, the nFET masking material 424 is removed. In one embodiment, the nFET masking material 424 removal may be performed by "wet" chemical etching.

Figure 45:
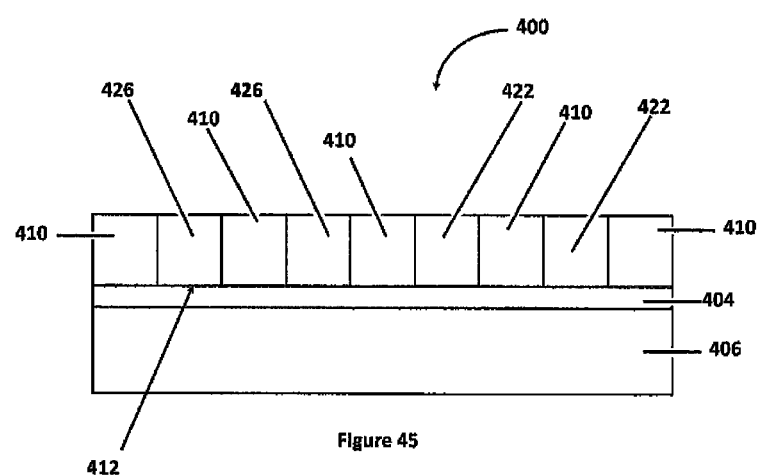

Next with reference to FIG. 45, the pFET channel material 426 and the nFET channel material 422 are made flush with the at least one patterned material structure 410. In one embodiment, this may be performed by CMP.

Figure 46:
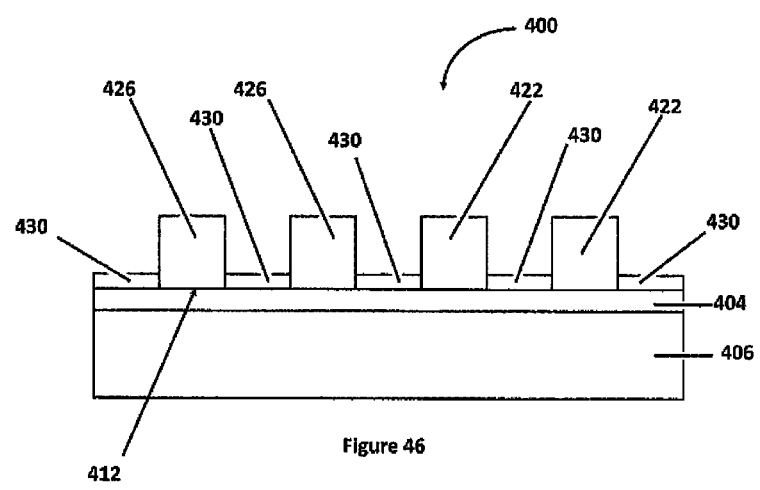

Next with reference to FIG. 46, the at least one patterned material structure 410 is recessed to recessed structure 430. In one embodiment, the recessing may be performed by plasma-based processing, sublimation-based methods or "wet" chemical etching. In one embodiment, the at least one patterned material structure 410 may be recessed to a depth range of 25-40 nm.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention.

While at least one exemplary embodiment has been presented in the foregoing detailed description, it should be appreciated that a vast number of variations exist. It should also be appreciated that the exemplary embodiment or embodiments described herein are not intended to limit the scope, applicability or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, the protection sought herein is as set forth in the claims below.

What is claimed:

1. A method, comprising:
   providing a substrate, the substrate having a top surface;
   forming material layer 1 on the substrate top surface;
   patterning of the material layer 1 thereby defining a plurality of trenches and a plurality of patterned material structures;
   forming a common stack material in the plurality of trenches on the substrate top surface;
   masking a first masking material in a first portion of the plurality of trenches and on a first portion of the plurality of patterned material structures proximate the first portion of the plurality of trenches;
   forming a first channel material in a second portion of the plurality of trenches;
   removing the first masking material;
   masking a second masking material in a second portion of the plurality of trenches and on a second portion of the plurality of patterned material structures proximate the second portion of the plurality of trenches;
   forming a second channel material in the first portion of the plurality of trenches;
   removing the second masking material; and
   recessing the plurality of patterned material structures.

2. The method of claim 1, wherein forming the first channel material in a second portion of the plurality of trenches leaves the first channel material protruding above the height of the plurality of patterned material structures and forming the second channel material in a first portion of the plurality of trenches leaves the second channel material protruding above the height of the plurality of patterned material structures.

3. The method of claim 2, further comprising, prior to recessing the plurality of patterned material structures, performing a planarization process to define the plurality of patterned material structures, the first channel material and the second channel material as having a flush top surface.

4. The method of claim 1, wherein the first masking material is a pFET masking material, the second masking material is an nFET masking material, the first channel material is an nFET channel material and the second channel material is a pFET channel material.

5. The method of claim 4, wherein the method of forming the first channel material comprises epitaxially growing the first channel material, and the method of forming the second channel material comprises epitaxially growing the second channel material.

6. The method of claim 4, wherein the pFET masking material and the nFET masking material are selected from the group consisting of $Si_3N_4$, TiN, or $SiO_2$, the nFET channel material is selected from the group consisting of Si or group III-V semiconductor materials, and the pFET channel material has a Ge content ranging from 25-100%.

7. The method of claim 1, wherein material layer 1 is an oxide, such as $SiO_2$, and is formed by PEALD, LPCVD, CVD, thermally grown or deposited with other methods.

8. The method of claim 7, wherein recessing the plurality of patterned material structures allows the first channel material and the second channel material to protrude above the plurality of patterned material structures.

9. The method of claim 1, wherein recessing the plurality of patterned material structures comprises plasma-based processing, sublimation-based processing or wet chemical etching the plurality of patterned material structures to a depth of about 15-30 nm.

10. The method of claim 1, wherein the plurality of trenches have a width of about 5-25 nm.

11. The method of claim 1, wherein the common stack material has a thickness of about 5-20 nm.

12. The method of claim 1, wherein the first channel material and the second channel material are different.

13. A method, comprising:
   providing a substrate, the substrate having a top surface;
   forming a common stack material on the substrate top surface;
   forming a material layer 1 on the common stack material;
   patterning of the material layer 1 thereby defining a plurality of trenches and a plurality of patterned material structures;
   masking a first masking material in a first portion of the plurality of trenches and on a first portion of the plurality of patterned material structures proximate the first portion of the plurality of trenches;

forming a first channel material in a second portion of the plurality of trenches;
removing the first masking material;
masking a second masking material on a second portion of the plurality of trenches and on a second portion of the plurality of patterned material structures proximate the second portion of the plurality of trenches;
forming a second channel material in the first portion of the plurality of trenches;
removing the second masking material; and
recessing the plurality of patterned material structures.

14. The method of claim 13, wherein forming the first channel material in a second portion of the plurality of trenches leaves the first channel material protruding above the height of the plurality of patterned material structures and forming the second channel material in a first portion of the plurality of trenches leaves the second channel material protruding above the height of the plurality of patterned material structures.

15. The method of claim 14, further comprising, prior to recessing the plurality of patterned material structures, performing a planarization process to define the plurality of patterned material structures, the first channel material and the second channel material as having a flush top surface.

16. The method of claim 13, wherein the first masking material is a pFET masking material, the second masking material is an nFET masking material, the first channel material is an nFET channel material and the second channel material is a pFET channel material.

17. The method of claim 16, wherein the method of forming the first channel material comprises epitaxially growing the first channel material, and the method of forming the second channel material comprises epitaxially growing the second channel material.

18. The method of claim 16, wherein the pFET masking material and the nFET masking material are selected from the group consisting of $Si_3N_4$, TiN, or $SiO_2$, the nFET channel material is selected from the group consisting of Si or group III-V semiconductor materials, and the pFET channel material has a Ge content ranging from 25-100%.

19. The method of claim 13, wherein recessing the plurality of patterned material structures comprises plasma-based processing, sublimation-based processing or wet chemical etching the plurality of patterned material structures to a depth of about 15-30 nm.

20. The method of claim 18, wherein recessing the plurality of patterned material structures allows the first channel material and the second channel material to protrude above the plurality of patterned material structures.

* * * * *